United States Patent [19]

Thienel

[11] Patent Number: 5,376,589
[45] Date of Patent: Dec. 27, 1994

[54] METHOD OF FABRICATING SIMILAR INDEXED DISSOCIATED CHIPS

[75] Inventor: Christoph Thienel, Reutlingen, Germany

[73] Assignee: Robert Bosch GmbH, Stuttgart, Germany

[21] Appl. No.: 70,371

[22] PCT Filed: Nov. 11, 1991

[86] PCT No.: PCT/DE91/00871
§ 371 Date: Jun. 3, 1993
§ 102(e) Date: Jun. 3, 1993

[87] PCT Pub. No.: WO92/10852
PCT Pub. Date: Jun. 25, 1992

[30] Foreign Application Priority Data

Dec. 5, 1990 [DE] Germany ............... 4038723

[51] Int. Cl.$^5$ ......................... H01L 21/302
[52] U.S. Cl. ..................... 437/226; 437/924; 437/8; 148/DIG. 28
[58] Field of Search ............ 437/226, 924, 8; 148/DIG. 28

[56] References Cited

U.S. PATENT DOCUMENTS 3,562,536  2/1971  Brunner et al. ............ 250/219
4,134,066  1/1979  Vogel et al. ............... 324/210
4,981,529  1/1991  Tsujita ....................... 148/33

FOREIGN PATENT DOCUMENTS 57-11370    10/1983  Japan .
59276777    12/1986  Japan .
62-46522     2/1987  Japan .
63-250148   10/1988  Japan .
63-262835   10/1988  Japan .
2-112260     4/1990  Japan .
3-087013     4/1991  Japan .

OTHER PUBLICATIONS

IBM Technical Disclosure Bulletin, vol. 14, No. 4, Sep. 1971, New York, pp. 1030–1031, R. C. Fahrni, et al, "Wafer Identification".

Primary Examiner—George Fourson
Assistant Examiner—David M. Mason
Attorney, Agent, or Firm—Kenyon & Kenyon

[57] ABSTRACT

Similar semiconductor chips (12–15), which are produced together on a plate and subsequently dissociated, are provided with identifying markings (17–20) containing their earlier position on the plate. If defects occur later in the dissociated chips, analyses can be made to determine whether defects occur with particular frequency in certain regions of the plate, or whether a statistical distribution exists.

18 Claims, 2 Drawing Sheets

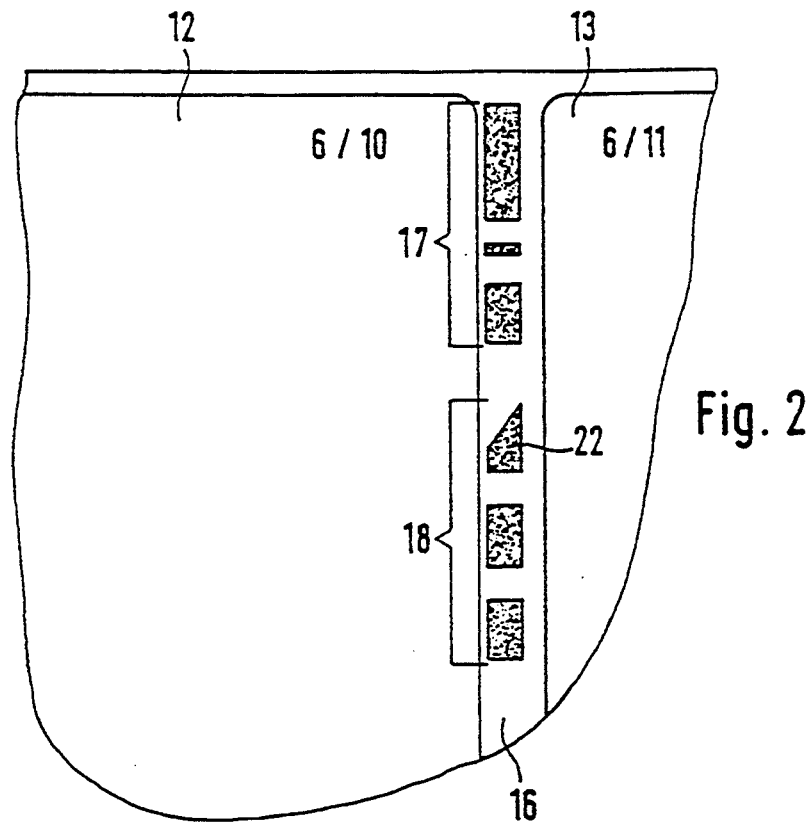
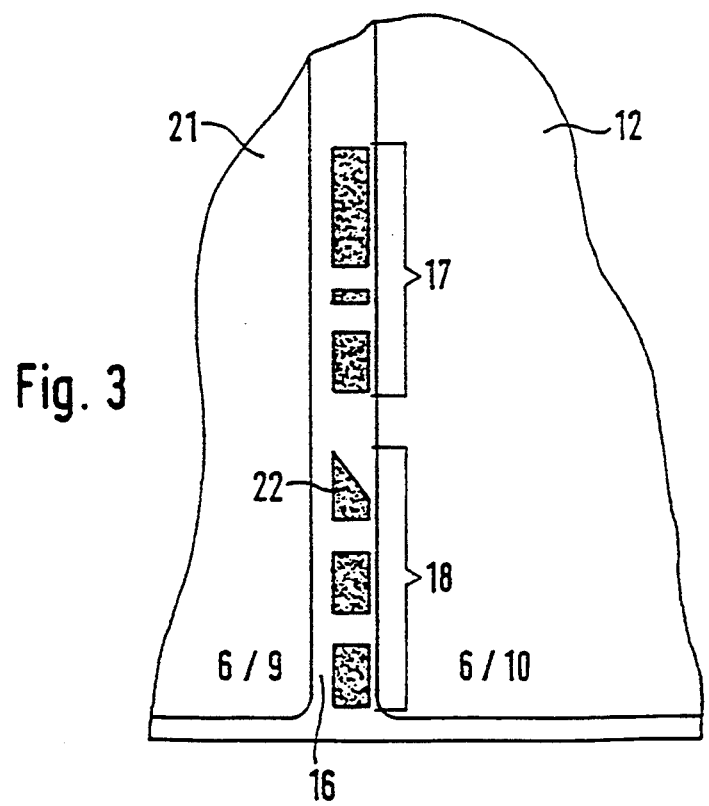

METHOD OF FABRICATING SIMILAR INDEXED DISSOCIATED CHIPS

FIELD OF THE INVENTION

The present invention relates to similar semiconductor chips, which are produced together on a plate and subsequently dissociated.

BACKGROUND INFORMATION

As is well known, nowadays semiconductor components or chips are efficiently produced on discoid plates, called wafers, which are sliced off of bar-shaped silicon monocrystals. Various technologies, such as photolithography, epitaxy, diffusion, masking methods and the like are used to form a plurality of similar integrated circuits on such a plate. After being separated into single chip crystals, they can no longer be differentiated from one another. If clusters of defects in the circuits occur later, it can no longer be determined afterwards whether these are statistically distributed defects or if they are defects that have accumulated in certain regions of the plates. It would be quite advantageous if, in searching for the cause of the defects, one were still able to discover later on the original position of the particular chip on the plate.

SUMMARY OF THE INVENTION

The present invention provides a method of producing first and second semiconductor chips from a plate of monocrystalline semiconductor material. First and second monolithically integrated circuits are formed on the plate. An identifying plate position marking is then provided on the edge area between the first and second circuits. The first and second circuits are dissociated to form the first and second chips, respectively. The width of the edge area is selected and the marking on the edge area is arranged such that the marking is retained on at least one of the first and second chips after the dissocation.

The advantage of the solution according to the present invention, is that even after the dissociation, the earlier position of the individual chips can be read off from the plate. One can then correlate the individual fates of the chips with their earlier position on the plate. Since these identifying markings can be applied together with the semiconductor structures of the chips during the manufacturing process, there is only a marginal increase in production expenditure. One merely needs to modify the photomask, for example, which can then be used to index all similar components during the planar process in a simple and especially robust manner.

The measures specified in the dependent claims make it possible to advantageously further develop and improve the semiconductor chips indicated in claim 1.

It proves to be particularly advantageous to configure the identifying markings on edge areas situated between the semiconductor structures (layouts) of adjacent semiconductor chips. One can thus avoid any kind of circuit-engineering interventions or controls, and ample space is available on the edge areas for the identifying markings. Another advantage is the ease with which the identifying markings can be read off from these edge areas. Already existing components can also be indexed with such identifying markings, without the necessity of having to change the layouts. The edge area between two chips, the so-called slicing trough, cannot be used anyway up to a certain width for layout components. This is because when the plate is sawn apart, on the one hand, a strip is sawn away and, on the other hand, slicing tolerances must be taken into consideration, whereby because of the adjusting tolerance, the position of the slicing trace within the slicing trough cannot be exactly determined beforehand.

The identifying markings allocated to the adjacent semiconductor chips are expediently offset toward the respective allocated semiconductor chip on the edge areas, which are situated in-between and are wider than the identifying markings. As a result, it is possible for the remaining identifying markings to be perfectly allocated to the particular chip independently of the adjusting tolerance of the slicing trace. The width of the identifying markings can be dimensioned, thereby, so that given an optimum middle cut, each chip, after being dissociated, still bears only its own identifying markings on its edge areas.

At least the edge area on one of the four sides of the semiconductor structure will be provided with at least one of the identifying markings. To increase the reliability of readings, even when there are faulty influences, several similar identifying markings can be provided. The edge areas of two mutually opposing sides or of all sides can also be provided with such identifying markings.

By developing the identifying markings as series of line or area elements, one is able to achieve a simple realization and easy readability. Since these line or area elements run, advantageously, through the edge areas perpendicularly to the chip edge, at the most they are shortened when the plate is cut and, therefore, do not lose their information content.

Above all, it is beneficial to have a binary coding of the sequences of line or area elements, because of the excellent readability it provides and its clear information content, which is hardly affected even by faulty influences.

The clear and simple readability can be further enhanced in that the identifying markings of each semiconductor chip have two essentially similar regions, which indicate the row and column numbers of the particular chip position.

Furthermore, a marking can also be provided to better distinguish between the two regions. This can be conceived as a directional pointer and preferably point to the other region and/or to the plate edge. In the simplest case, one of the line or area elements can be conceived as a marking to differentiate between the two regions. In addition, such a configuration allows the rotational position of a dissociated chip to be determined. Moreover, it prevents the two regions, and thus the row and column numbers, from being mixed up.

The identifying markings can advantageously contain still more chip-specific data, such as a variant marking, process modification, dates and the like.

In principle, the identifying markings can be applied in almost every process step entailed in chip production. These identifying markings can be presented quite simply and robustly as oxide elements in one lithographic step, in which oxide windows are opened for the last time. In the bipolar planar process, this would be, for example, the contact-window plane. The indexing then takes place during the planar process without any additional expenditure. The oxide structure of the identifying markings ensures that, in case of later technological analyses which require removal of the front-side metal, the identifying markings would still be available afterwards.

To apply the identifying markings, one needs merely to change the master mask. All copies of the master mask receive the identifying markings automatically during the copying operation without entailing any additional expenditure. Existing layouts can easily be provided with these types of identifying markings, even afterwards, by modifying the mask.

BRIEF DESCRIPTION OF THE DRAWINGS

Exemplified embodiments of the invention are depicted in the drawings and clarified in greater detail in the subsequent description. The Figures show:

FIG. 2 shows binary-coded area elements in the upper region of the right lateral edge of a chip--.--.

FIG. 3 shows the binary-coded area elements in the lower region of the left lateral edge of the same chip.

DETAILED DESCRIPTION

Figure 1:
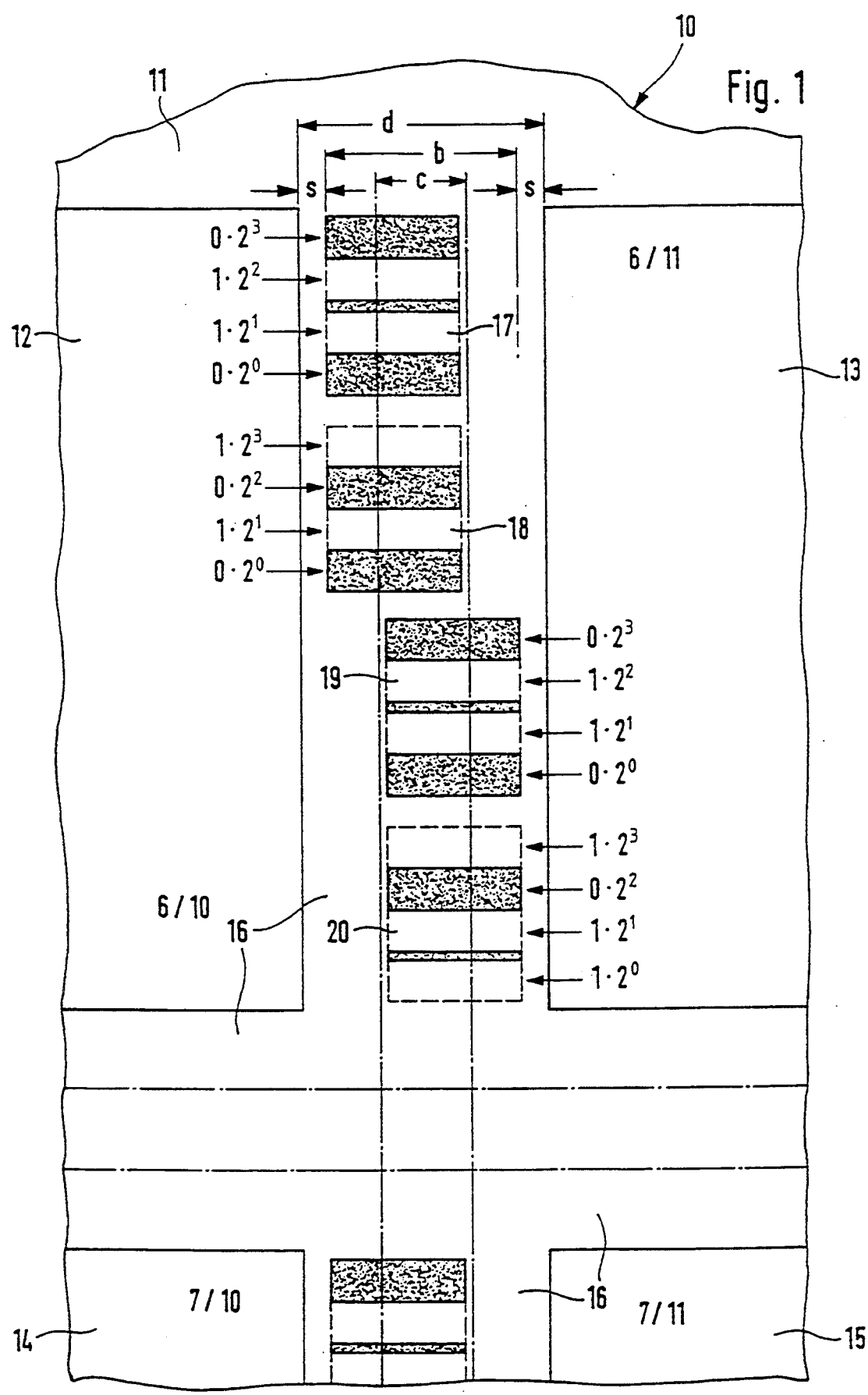
FIG. 1 shows the edge area provided with binary-coded line elements between two chips in a schematic representation--.--.

The schematic representation according to FIG. 1 shows the top view of a partial area 10 of a wafer 11, on which are arranged a plurality of similar chips containing electronic components or electronic circuits. Four such chips 12–15 are depicted in cutaway portions in FIG. 1. These chips are applied to the wafer 11 using known methods from semiconductor technology, for example, using the bipolar planar process. The chips are arranged symmetrically in rows and columns, whereby chip 12 is supposed to be arranged in row 6, column 10; chip 13 in row 6, column 11; chip 14 in row 7, column 10; and chip 15 in row 7, column 11. For the sake of clarity, the inner structure of the chips is not depicted.

Edge areas 16 of the width d, representing the so-called slicing troughs, are situated between the individual chips 12–15. These edge areas 16 cannot be used, up to a certain width, for layout components of the chips, because when the wafer 11 is sawn apart, slicing cuts of the width c are made through the edge areas 16 to dissociate the chips. As a result, edge-area strips of the width c fall off. The remainder of the width must be kept free, as the position of the slicing trace within the edge areas 16 cannot be exactly predicted because of the adjusting tolerance. Therefore, the slicing cut can be situated all the way to the left on chip 12, or all the way to the right on chip 13.

Instead of dissociating the chips by sawing the wafer 11 apart, the edge areas 16 can also be scribed and, after that, broken off. In any case, however, a strip of material falls off from the edge area 16.

Existing identifying markings consisting of binary-coded line elements are provided in the vertical edge area 16 between chips 12 and 13, or rather chips 14 and 15. These line elements run thereby perpendicularly to the edge of the semiconductor structures (layouts) of the chips, thus right across the edge areas 16. The two upper regions 17, 18 of identifying markings, which are offset to the left, are allocated to chip 12, while the two lower regions 19, 20 of identifying markings, which are offset to the right, are allocated to chip 13. The regions 17, 18 thereby form a safety clearance s with the chip 12, as do the regions 19, 20 with chip 13. This safety clearance s serves to rule out with certainty any affects of the identifying markings on the semiconductor structures of the chips. As a result of these safety clearances s, the usable width of the edge areas is reduced to the value b. To clarify the functions and the configuration of the identifying markings, the representation according to FIG. 1 is not shown true-to-scale. In actuality, the edge areas and identifying markings are substantially smaller in comparison to the size of the chips. FIGS. 2 and 3 give a rough idea of the actual size ratios. The following values serve as numerical examples: $d=80$ $\mu$m, $s=10$ $\mu$m, $c=30$ $\mu$m. Thus, given a symmetrical cut, one strip remains in each case for the identifying markings of the width 15 $\mu$m.

The areas 17 and 19 each convey the row number for chips 12 and 13; in the present case, the column numbers for row 6 and areas 18, 20, and, in the present case, for rows 10 or 11. The line elements in areas 17 through 20 consist of oxide, for example of structured emitter oxide. The line elements thereby represent 0-bits, while the free locations embody 1-bits. Between two free locations, thus between two 1-bits, a narrow oxide strip is arranged for the sake of clarification. The digital coding through the line elements is clarified in FIG. 1 with appropriate numerical specifications.

From a pure technological standpoint, the identifying markings are able to be applied to the wafer 11 in almost every process step during chip production. The identifying markings can be shown quite simply and robustly in one lithographic step, in which oxide windows are opened for the last time. During the bipolar planar process, this would be the contact-window plane. To this end, when production takes place in the pattern generator and in the repeater, exclusively the contact-window mask must be provided with the identifying marking structures next to each chip. All other masks or planes remain unchanged. In the region of the bits, the oxide in the slicing trough is not cauterized, rather it is only removed where one bit is supposed to be set in the binary representation of the column or row numbers. The width of the oxide window to be Opened and the clearance between two adjacent windows must be selected on the basis of the occurring etching tolerances.

As a variation of the depicted and clarified arrangement of the identifying markings, one can, of course, also select an inverse arrangement, in which the oxide elements represent the 1-bits. In principle, one can also eliminate the narrow clearance strips between two locations that have been etched free, since their sole purpose is to improve readability. Furthermore, it is possible to group several arrangements of column or row areas on one side of the chip, or to distribute them over several sides. In the depicted embodiment, the identifying markings are arranged in each case on the right lateral edge, above, and on the left lateral edge, below. The upper and lower edges can also be provided with identifying markings.

In the most favorable case, the slicing cut is made symmetrically, so that a middle strip of the width c is not needed. In this case, all that is retained on the remaining lateral edge areas of the dissociated chips are the respective, allocated identifying markings. In principle, this represents the most favorable solution. However, if the slicing cut runs asymmetrically, which can hardly be prevented in practice, then in the most unfavorable case, the identifying markings on the narrower strip can be completely dropped (when this strip is smaller than or equal to the safety clearance s). In addition, the wider strip of the adjacent chip still contains identifying markings, which are not allocated to this chip. One is, nevertheless, still able to differentiate, since the allocated identifying markings exhibit substantially larger dimensions due to the staggered arrangement. The omission of the identifying markings on the adjacent chip likewise has no adverse effect, since a wider edge area is retained, in turn, for this chip on the diametrically opposing side.

In FIG. 2, the right upper area of chip 12, and in FIG. 3, the left lower area of this chip are shown true-to-scale. While to simplify the representation in FIG. 1, only a 4-bit marking was provided for the column or row numbers, a 5-bit marking is realized in FIGS. 2 and 3. The regions 17 and 18 of the identifying markings are identical on the upper right and on the lower left lateral edges. Contrary to FIG. 1, they are portrayed here as area elements, which no longer actually exhibit a line form. The subsequent chip 21 is arranged in column 9 on the left lateral edge area of chip 12.

In each case, the uppermost identifying element 22 of the regions 18 indicating the column is conceived as a type of arrowhead and points away from the allocated chip 12 and toward the edge area of the unsliced wafer. It is thus guaranteed that, on the one hand, one can differentiate with certainty between row and column numbers and, moreover, that the earlier rotational position on the wafer can be determined for the dissociated chip.

Over and above that, the edge areas 16 can contain still further chip-specific data, such as the identification of different variants of one chip type, the process modification, manufacturing date, production location, and the like. The identifications for these data can be distributed over the four edge areas.

I claim:

1. A method of producing first and second semiconductor chips from a plate of monocrystalline semiconductor material, comprising the steps of:
    forming first and second monolithically integrated circuits on the plate, the first and second monolithically integrated circuits defining an edge area therebetween;
    providing at least one identifying plate position marking on the edge area;
    dissociating the first and second monolithically integrated circuits at a point within the edge area to form the first and second semiconductor chips, respectively
    the at least one marking being retained on at least one of the first and second semiconductor chips after the dissociation.

2. The method according to claim 1, wherein the first and second semiconductor chips are identical.

3. The method according to claim 1, wherein the first and second monolithically integrated circuits are disposed side-by-side.

4. The method according to claim 1, wherein the at least one marking on the edge area is offset toward the at least one of the first and second semiconductor chips, the edge area being wider than the at least one marking.

5. The method according to claim 1, wherein the plate is four-sided.

6. The method according to claim 1, wherein the edge area has two mutually opposing sides, the two sides being provided with respective markings.

7. The method according to claim 1, wherein the at least one marking is a series of elements selected from the group including line elements and area elements.

8. The method according to claim 7, wherein the line elements and area elements are perpendicular to a side of the at least one of the first and second semiconductor chips that is adjacent to the edge area.

9. The method according to claim 7, wherein the line elements and area elements are binary-coded.

10. The method according to claim 1, further comprising the step of providing the at least one marking with first and second portions, the first and second portions indicating row and column numbers, respectively, of the at least one of the first and second semiconductor chips on the plate.

11. The method according to claim 1, further comprising the step of providing the at least one marking with first and second regions, the first region indicating row and column numbers of the first semiconductor chip on the plate, the second region indicating row and column numbers of the second semiconductor chip on the plate.

12. The method according to claim 11, wherein the at least one marking is a directional pointer.

13. The method according to claim 12, wherein the at least one marking points to one of the first and second regions.

14. The method according to claim 11, wherein the at least one marking differentiates the first and second regions.

15. The method according to claim 14, wherein an element of the at least one marking selected from the group including a line element and an area element differentiates the first and second regions.

16. The method according to claim 1, wherein the at least one marking contains chip data indicating at least one of a variant marking, a process modification and a date.

17. The method according to claim 1, wherein the at least one marking includes oxide elements.

18. The method according to claim 17, wherein the oxide elements are provided using a lithographic technique.

* * * * *